US006849386B2

(12) United States Patent
Hirano et al.

(10) Patent No.: US 6,849,386 B2
(45) Date of Patent: Feb. 1, 2005

(54) METHOD FOR PREPARING MASTER PLATE USEFUL FOR MAKING LITHOGRAPHIC PRINTING PLATE WITHOUT NEED OF DAMPENING WATER

(75) Inventors: Tsumoru Hirano, Haibara-gun (JP); Koji Sonokawa, Haibara-gun (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/413,575

(22) Filed: Apr. 15, 2003

(65) Prior Publication Data

US 2004/0031409 A1 Feb. 19, 2004

(30) Foreign Application Priority Data

Apr. 15, 2002 (JP) ....................................... 2002-112093

(51) Int. Cl.[7] .................................................. G03F 7/11

(52) U.S. Cl. ................. 430/302; 430/272.1; 430/273.1; 430/303

(58) Field of Search ........................... 430/272.1, 273.1, 430/302, 303

(56) References Cited

U.S. PATENT DOCUMENTS 5,811,210 A * 9/1998 Kawamura et al. ........... 430/17

FOREIGN PATENT DOCUMENTS

JP 50-158405 12/1975
JP 2000-301849 10/2000

* cited by examiner

*Primary Examiner*—Barbara L. Gilliam
(74) *Attorney, Agent, or Firm*—Sughrue Mion, PLLC

(57) ABSTRACT

An object of the present invention is to provide a method for manufacturing such a dry lithographic printing master plate that has eliminated uneven plate performance and more specifically that provides a stable adhesiveness between a heat-sensitive layer and a silicone rubber layer as well as a high aging stability of a coating solution. Provided is a method for preparing a master plate useful for making a dry lithographic printing plate comprising at least a heat-sensitive layer and a silicone rubber layer which are stacked in this order on a substrate, said method comprising the steps of: (1) dissolving a diorgano-polysiloxane and a curing catalyst in a solvent; (2) dissolving a cross-linking agent in a solvent; (3) mixing the solution obtained in the step (1) with the solution obtained in the step (2); and (4) applying the mixture obtained in the step (3) over the heat-sensitive layer to thereby form the silicone rubber layer.

12 Claims, No Drawings

METHOD FOR PREPARING MASTER PLATE USEFUL FOR MAKING LITHOGRAPHIC PRINTING PLATE WITHOUT NEED OF DAMPENING WATER

TECHNICAL FIELD OF THE INVENTION

The present invention generally relates to a method for manufacturing a master plate useful for making a lithographic printing plate having no need of dampening water (hereinafter referred to as a dry lithographic printing master plate), which enables a printing without the need for the dampening water, and in particular to a method for manufacturing the dry lithographic printing master plate that provides a high stability in manufacturing.

DESCRIPTION OF THE PRIOR ART

A typical printing method having need of dampening water according to a prior art has exhibited a serious problem that it is difficult to control a delicate balance between a dampening water and an ink, in which the ink may be emulsified or mixed into the dampening water, leading to an improper concentration of the ink and/or a greasing which in turn may become factors in damaged papers. In contrast, a dry lithographic printing plate, which requires no dampening water, has plenty of advantages. There has been suggested a variety of methods involved in such dry lithographic printing plate for conducting lithography without the use of any dampening water, as disclosed in, for example, Japanese Patent Publication Nos. Sho 44-23042, Sho 46-16044, Sho 54-26923, Sho 56-14976, Sho 56-23150 and Sho 61-54222, and Japanese Patent Laid-open Publication Nos. Sho 58-215411, Hei 2-16561 and Hei 2-236550. On the other hand, in recent rapid advance achieved in a pre-press system and an output system such as an imager setter, a laser printer and so on, some methods have been suggested for obtaining a printing plate by newly introduced manufacturing method therefor such as a computer-to-plate or a computer-to-cylinder methods utilizing digitized date of images to be printed. In conjunction with this trend, new types of printing materials have been desired for those printing systems, which in fact, are currently under development.

Exemplary methods for producing the dry lithographic printing plate by way of laser writing have been disclosed in, for example, Japanese Patent Publication No. Sho 42-21879, Japanese Patent Laid-open Publication Nos. Sho 50-158405, Hei 6-55723, Hei 6-186750, Hei 7-309001, Hei 9-104182, Hei 9-104182, Hei 9-146265, Hei 9-23692 and Hei 9-244228, U.S. Pat. No. 5,339,737, U.S. Pat. No. 5,353,705 and U.S. Pat. No. 5,398,580, and WO-9,401,280. Those publications have suggested an art in which an ink-repellent silicone rubber layer is coated on a heat-sensitive layer containing a laser light absorbent such as carbon black and a self-oxizable binder such as nitro-cellulose, and then the silicone rubber layer is partially removed by the laser irradiation to give an ink adhesive region so as to provide the printing plate for dry printing. Those printing plates, however, have another problem that a higher intensity of laser light is required to break the heat-sensitive layer.

In addition, there has been disclosed a heat-mode dry lithographic printing master plate in U.S. Pat. No. 5,379,698, which has employed a metallic thin film as the heat-sensitive layer. However, this printing plate has also a problem of bad adhesion between the metallic thin film layer and the silicone rubber layer, in which the silicone rubber layer is likely to be stripped in a periphery of an imaging area during being exposed to the laser, and any ink that may possibly adhere to that stripped region will produce a defect on the printed matter.

Further, disadvantageously there has been another problem of manufacturing variation in the adhesiveness between the heat-sensitive layer and the silicone rubber layer. Although one method to address this problem has been disclosed in Japanese Patent Laid-open Publication No. 2000-301849, suggesting a method for mixing raw materials for the silicone layer, any satisfactory adhesiveness has not been so far obtained.

SUMMERY OF THE INVENTION

Accordingly, an object of the present invention is to provide a method for preparing a dry lithographic printing master plate that has no variation in printing plate performance and in specific, that has a stable adhesiveness between a heat-sensitive layer and a silicone rubber layer as well as a high aging stability of a coating solution.

To accomplish the above-stated object, the present invention provides the following features.

Specifically, the present invention provides a method for preparing a master plate useful for making a dry lithographic printing plate comprising at least a heat-sensitive layer and a silicone rubber layer which are stacked in this order on a substrate, said method characterized in comprising the steps of: (1) dissolving a diorgano-polysiloxane and a curing catalyst in a solvent; (2) dissolving a cross-linking agent in a solvent; (3) mixing the solution obtained in the step (1) with the solution obtained in the step (2); and (4) applying the mixture obtained in the step (3) over the heat-sensitive layer to thereby form the silicone rubber layer. The present invention further provides a method for preparing a master plate useful for making a dry lithographic printing plate comprising at least a heat-sensitive layer and a silicone rubber layer which are stacked in this order on a substrate, said method characterized in comprising the steps of: (5) dissolving a diorgano-polysiloxane having an addition reactive functional group and a curing catalyst in a solvent; (6) dissolving a compound having at least two or more Si—H groups and a reaction control agent in a solvent; (7) mixing the solution obtained in the step (5) with the solution obtained in the step (6); and (8) applying the mixture obtained in the step (7) over the heat-sensitive layer to thereby form the silicone rubber layer.

The inventor of the present invention has found, in a master plate useful for making a dry lithographic printing plate comprising at least a heat-sensitive layer and a silicone rubber layer which are stacked in this order on a substrate, that the adhesiveness between the heat-sensitive layer and the silicone rubber layer and the curing characteristic of the silicone rubber layer depend on a reaction between diorgano-polysiloxane and a cross-linking agent for inducing a cross-linking reaction of the former, and consequently assumed that the reaction between the diorgano-polysiloxane and the cross-linking agent in the coating solution needs to be suppressed in order to eliminate variation of the performance. Based on this assumption, the inventor has reviewed many different methods for preparing the coating solution as it is in the stage of manufacturing and found that the method of the present invention can advantageously achieve an improved aging stability of the coating solution and allow such a master plate useful for making the dry lithographic printing plate to be produced that can eliminate the variation in its performance after being manufactured.

DESCRIPTION OF THE PREFERRED EMBODIMENTS

The present invention will now be described below in detail.

A method of the present invention is defined as a method in which a heat-sensitive layer is formed on a substrate and further a silicone rubber layer is formed on top of this heat-sensitive layer through a reaction induced by a method as described below to thereby produce a master plate useful for making a dry lithographic printing plate. More specifically, the silicone rubber layer may be formed by curing the silicone of condensing type by using a cross-linking agent or by way of addition polymerization of the silicone of addition type by using a catalyst.

If the silicone of condensing type is chosen, then a composition including (a) a diorgano-polysiloxane, (b) a curing catalyst and (c) a cross-linking agent is used to form the silicone rubber layer on top of the heat-sensitive layer in accordance with a method including the following steps.

Specifically, the method comprises the steps of (1) dissolving the diorgano-polysiloxane and the curing catalyst in a solvent; (2) dissolving the cross-linking agent in a solvent; (3) mixing the solution obtained in the step (1) with the solution obtained in the step (2); and (4) applying the mixture obtained in the step (3) onto the heat-sensitive layer to form the silicone rubber layer.

The steps (1) and (2) are performed in appropriate vessels, respectively, by adding respective compounds into the solvent or by adding the solvent into the compounds. During or after the adding step, preferably the solution may be stirred mechanically or magnetically, whichever is appropriate, so as to make the solution uniform. It is needless to say that the conditions including the way and the period of stirring may be changed appropriately depending on different conditions employed such as a manufacturing scale and a temperature. It is a matter of course that although the dissolving step is typically carried out at a room temperature, the temperature for the dissolving step may be determined appropriately depending on the compounds and the solvents to be used and/or other conditions.

Solutions obtained in the above steps (1) and (2) may be mixed together according to a wide variety of methods known in the art thus to carry out the step (3).

Thus obtained mixture from the step (3) may be applied onto the heat-sensitive layer in any arbitrary coating methods including a bar coating, a curtain coating and the like (step (4)).

Further, in the above-specified method, preferably the mixing step of (3) may be performed immediately before the application step of (4), or the application step of (4) may be performed immediately after the mixing step of (3). It implies that favorably a transition period from the end of the mixing step of (3) to the beginning of the application step of (4) is a short time, preferably no longer than 5 minutes, more preferably in a range of 1 second to 3 minutes.

In said application step of the above method for the layer of silicone rubber of condensing type, preferably such a composition may be used that is formed by adding (b) condensing type cross-linking agent of 2 to 50 parts by weight, preferably of 5 to 30 parts by weight and (c) curing catalyst of 0.01 to 40 parts by weight, preferably of 0.02 to 10 parts by weight, to (a) diorgano-polysiloxane of 100 parts by weight.

The diorgano-polysiloxane of said component (a) is designated as such a polymer having a repeating unit represented by the following general formula.

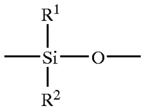

In the general formula, $R^1$ and $R^2$ may represent an alkyl group, a vinyl group or an aryl group, having 1 to 10 carbon atoms, or may be any other suitable substituents. Typically, it is preferred that 50% or more of the $R^1$ and $R^2$ may be a methyl group.

Preferably, such a diorgano-polysiloxane to be used have, as respective end groups thereof, carbon-carbon double bonds and/or hydroxyl groups, and more preferably hydroxyl groups.

Further, preferably the diorgano-polysiloxane (a) may be the one having a number average molecular weight of 3,000 to 600,000, more preferably 5,000 to 100,000.

The cross-linking agent (b) may be any type of cross-linking agent so far as it can be generally used for inducing a cross-linking reaction in residues of polysiloxane, and preferably such type of agent that induces the cross-linking reaction of condensing type, more preferably the one designated by the following general formula:

$$R_m\text{—Si—}X_n \quad (m+n=4,\ n\geqq 2) \qquad \text{(I)}$$

wherein, R is synonymous with the above-explained $R^1$ or $R^2$, and X represents a halogen atom such as Cl, Br and I, a hydrogen atom, a hydroxyl group or such an organic substituent as expressed below.

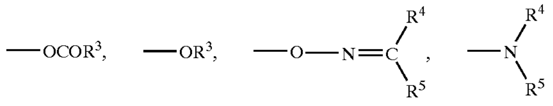

In the above formulas, $R^3$ represents an alkyl group having 1 to 10 carbon atoms or an aryl group having 6 to 20 carbon atoms, while $R^4$ and $R^5$ respectively represent an alkyl group having 1 to 10 carbon atoms.

The curing catalyst (c) may include a salt of carboxylic acid with a metal such as tin, zinc, lead, calcium, manganese and so on, for example, dibutyl laurate, lead octylate, lead naphtherate, or conventionally known catalyst such as chloroplatinic acid.

Then, the case of the silicone of addition type will be described. When the silicone of addition type is used, the silicone rubber layer may be formed on the heat-sensitive layer by using a composition containing (d) a diorgano-polysiloxane having an addition reactive functional group, (e) a curing catalyst, (f) organohydrogen-polysiloxane having at least two or more Si—H groups, and (g) a reaction control agent, according to a method comprising the steps as specified below.

Specifically, the method comprises the steps of: (5) dissolving a diorgano-polysiloxane having an addition reactive functional group and a curing catalyst in a solvent; (6) dissolving a compound containing at least two or more Si—H groups and a reaction control agent in a solvent; (7) mixing the solution obtained in the step (5) with the solution obtained in the step (6); and (8) applying the mixture obtained in the step (7) onto the heat-sensitive layer to thereby form the silicone rubber layer. Each of the steps (5) to (8) may be carried out under the similar conditions as specified in the above-described corresponding steps of (1) to (3).

Further, in the method as described above, the step (5) may be divided into two steps, in which at first (5-1) the diorgano-polysiloxane having addition reactive functional group is dissolved in the solvent, and subsequently (5-2) the curing catalyst is added into the solution obtained in the step (5-1).

Further, in the method as described above, preferably the mixing step of (7) is performed immediately before the application step of (8), or the application step of (8) is performed immediately after the mixing step of (7). It implies that favorably a time period from the end of the mixing of (7) to the beginning of the application of (8) is a short time. Preferably, the time period is not longer than 5 minutes, more preferably within 1 second to 3 minutes.

In said application step of the above method for the layer of silicone rubber of addition type, preferably such a composition may be used that is formed by adding (e) curing catalyst of 0.00001 to 10 parts by weight, preferably 0.00002 to 1 parts by weight, (f) organohydrogen-polysiloxane having at least two or more Si—H groups of 0.1 to 30 parts by weight, preferably 0.5 to 20 parts by weight and (g) a reaction control agent of 0.1 to 10 parts by weight, preferably 1 to 5 parts by weight, to (d) diorgano-polysiloxane having the addition reactive functional group of 100 parts by weight.

The diorgano-polysiloxane having the addition reactive functional group, (d), may be such an organo-polysiloxane that contains at least two alkenyl groups (preferably vinyl groups) directly bonded to a silicone atom within one molecule, in which the alkenyl groups may be positioned in any location of molecular chain including end and intermediate locations thereof, and that may have, as the organic groups other than the alkenyl groups, substituent or non-substituent alkyl groups or aryl groups having 1 to 10 carbon atoms. Further, the component (d) may optionally include a hydroxyl group only in a small amount. Preferably the component (d) has a number average molecular weight of 3,000 to 1,000,000, more preferably 5,000 to 500,000.

The component (f) may include polysiloxane having at least two Si—H groups in the intermediate or end locations of the molecular chain, including, for example, such a compound as represented by the general formula as specified below.

(II)

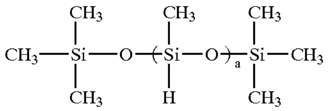

(III)

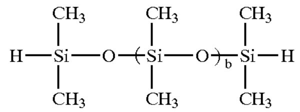

(IV)

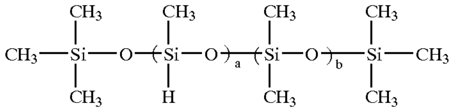

(V)

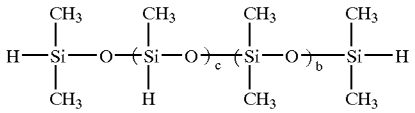

In each of the above formulas, "a" denotes an integer equal to or greater than 2, "b" denotes an integer equal to or greater than 1, and "c" denotes an integer equal to or greater than 1, respectively. Preferably, the "a" denotes the integer of 2 to 100, more preferably 2 to 10, the "b" denotes the integer of 1 to 100, more preferably 1 to 10, and the "c" denotes the integer of 1 to 100, more preferably 1 to 10.

In addition to those specified above, cyclic polymethylsiloxane may be used.

Preferably, the polysiloxane having the Si—H group may have two or more, more preferably three or more, Si—H groups within one molecule.

The component (e) may be arbitrarily selected from the group of known polymerization catalysts, and a platinum compound may be particularly preferred, including simple substance of platinum, platinum chloride, chloroplatinic acid, platinum coordinated with olefin and so on.

Further, the reaction control agent (g) is a component to be added in order to control a curing rate of the silicone rubber layer, and may include such reaction control agents, for example, as organo-polysiloxane containing a vinyl group, represented by tetracyclo(methylvenyl)siloxane, an alcohol containing carbon-carbon triple bond, aceton, methyl ethyl keton, methanol, ethanol, propylene glycol monomethylether and so on.

It is to be noted that the composition for silicone rubber layer of said condensing type or addition type may comprise, if necessary, an adhesion auxiliary and/or a photopolymerization initiator including a micro powder of minerals such as silica, calcium carbonate, titanium oxide, and a silane coupling agent, a titanate coupling agent, an aluminum coupling agent and so on.

As the solvent to be used in the present invention for dissolving the composition for the silicone rubber layer therein, preferably aliphatic hydrocarbons or aromatic hydrocarbons may be employed. More preferably, aliphatic hydrocarbons may be employed. Further, it is needless to say that a concentration of the solution in each of the steps may be determined appropriately by taking into consideration a stirring efficiency, a coating property and so on, and for example, the concentration thereof in each of the steps (1), (2), (5) and (6) may be typically in a range of 10 to 200 g/L, preferably 30 to 150 g/L, and more preferably 50 to 100 g/L, while a concentration of the ultimate coating solution may be typically in a range of 10 to 200 g/L, preferably 30 to 150 g/L and more preferably 50 to 100 g/L.

Preferably, a film thickness of the ink repellent silicone rubber layer of the present invention may be in a range of 0.5 to 5 $g/m^2$ measured as a dry film thickness, and more preferably in a range of 1 to 3 $g/m^2$. The silicone rubber layer thickness lower than 0.5 $g/m^2$ will lead to a deteriorated ink repellent property, which may in turn problematically stimulate a scar creation in the layer, while the thickness higher than 5 $g/m^2$ may deteriorate image reproducibility and ink mileage.

The silicone rubber layer applied in the above-described manner may be typically dried after the application at a temperature in a range of 80 to 160° C. for about 20 seconds to 3 minutes.

The heat-sensitive layer used in the present invention is a specific layer having a function for transforming laser light to heat (light to heat transformation, hereafter referred to as light/heat transformation), and any known heat-sensitive layers having this kind of function may be employed.

[Light/heat transforming agent]

A light/heat transforming agent used in the present invention may employ any known substances having a function for transforming the laser light used in writing to the heat (i.e., light/heat transformation), and in specific, it has been conventionally known that when an infrared laser is employed as a laser light source, a variety of organic and inorganic materials capable of absorbing the light having a certain wavelength used as the writing laser may be usable, including an infrared ray absorbing pigment, a near infrared ray absorbing pigment, an infrared ray absorbing dye, a near infrared ray absorbing dye, an infrared ray absorbing metal, a near infrared ray absorbing metal, an infrared ray absorbing metallic oxide, a near infrared ray absorbing metallic oxide and so on. Among those, most preferably the near infrared absorbing pigment may be used.

Those light/heat transforming agents may be used in the form of a mixed film combined with other components such as binder, additives and so on, and further those infrared ray absorbing metal and infrared ray absorbing metallic oxide may be also used in the form of a single thin film. 0032

Such single film may be formed on the substrate by depositing metal such as aluminum, titanium, tellurium, chrome, tin, indium, bismuth, zinc and lead, or alloy, metallic oxide, metallic carbide, metallic nitride, metallic boride, metallic fluoride thereof, organic pigment or the like by the evaporation method, the sputtering method or the like. Among those materials, most preferably the metal such as aluminum, titanium, tellurium, chrome, tin, indium, bismuth, zinc and lead may be formed into thin film, i.e. the metallic thin film.

The light/heat transforming agent to be dissolved or dispersed into other components to form the mixed film according to the coating method may include by way of example: a variety of carbon black, such as acid carbon black, basic carbon black and neutral carbon black; a variety of carbon black having a surface modification or a surface coating for improving dispensability and so on; black pigment such as nigrosines, aniline black and cyanine black; green pigment of phthalocyanines or naphthalocyanines; carbon graphite; aluminum; iron powder; metallic complex of diamines; metallic complex of dithiols; metallic complex of phenol-thiols; metallic complex of mercapto-phenols; aryl aluminum metallic salts; inorganic compound containing crystal water; copper sulfate; chrome sulfide; silicate compound; and metallic oxide such as titanium oxide, vanadium oxide, manganese oxide, iron oxide, cobalt oxide, tungsten oxide and indium-tin oxide, as well as hydroxide and sulfate thereof, and further, the metal powder of bismuth, tin, tellurium, iron and aluminum may be preferably added thereto as an additive. In addition to those described above, the light/heat transforming agent to be added may include, but not be limited to, an organic pigment "Infrared Sensitizing Pigment" (by Matuoka, Plenum Press, New York, 1990) and a variety of compounds disclosed in, for example, the specifications of the publications of U.S. Pat. No. 4,833,124, EP-321923, U.S. Pat. No. 4,772,583, U.S. Pat. No. 4,942,141, U.S. Pat. No. 4,948,776, U.S. Pat. No. 4,948,777, U.S. Pat. No. 4,948,77.8, U.S. Pat. No. 4,950,639, U.S. Pat. No. 4,912,083, U.S. Pat. No. 4,952,552 and U.S. Pat. No. 5,023,229.

Among those compounds as described above, most preferably the carbon black may be used from the viewpoint of a light/heat transforming rate, economical efficiency and ease in handling.

The carbon black may be classified according to its manufacturing process into furnace black, lamp black, channel black, roll black, disc black, thermal black, acetylene black and so on, wherein a wide variety of furnace blacks of different particle sizes and different features is commercially available and preferably used owing to its low price.

As for the carbon black, a degree of aggregation of its primary particles may affect a sensitivity of a plate. If the degree of aggregation of the primary particles of the carbon black is high (has a high structure geometry), then in the comparison with those of the same amount of additives, a blackness level of the plate will not be enhanced and accordingly the absorptivity of the laser light is left in low level, resulting in the deteriorated sensitivity. Further disadvantageously, the high aggregation of the particles may increase a viscosity of the solution to be applied for forming the light/heat transforming layer and make the solution thixotropic, which makes it difficult to handle the solution and leads to unevenness in the coated film. On the other hand, if the oil absorption is low, the dispersibility of the carbon black will be decreased, resulting also in the deteriorated sensitivity of the plate. The degree of aggregation of the primary particles of the carbon black may be compared to one another by using the value of the oil absorption, wherein the higher oil absorption indicates the higher degree of the aggregation and the lower oil absorption indicates the lower degree of the aggregation. This means that preferably the carbon black having its oil absorption in a range of 20 to 300 ml/100 g, more preferably in a range of 50 to 200 ml/100 g, may be used. The oil absorption is measured in accordance with the JIS K6221A method.

Besides, a variety of carbon blacks having different particle sizes is commercially available, and the particle size of the primary particle thereof also affects the sensitivity of the plate. If an average particle size is too small, then the light/heat transforming layer itself is affected to be transparent and no more able to absorb the laser light efficiently, leading to the deteriorated sensitivity of the plate. In contrast, if the size is too large, then the particles will not be dispersed in high density sufficient to increase the blackness level of the light/heat transforming layer, and the laser light could not be absorbed efficiently, also leading to the deteriorated sensitivity of the plate. This means that preferably the carbon black having the average particle size within a range of 10 to 50 nm, more preferably in a range of 15 to 45 nm, may be used.

Further, the conductive carbon black may be used in order to improve the sensitivity of the plate. An electric conductivity in this case may preferably fall in a range of 0.01 to 100 $\Omega^{-1}$ $cm^{-1}$, more preferably in a range of 0.1 to 10 $\Omega^{-1}$ $cm^{-1}$. Specifically, "CONDUCTEX 40–220", "CONDUCTEX 975 BEADS", "CONDUCTEX 900BEADS", "CONDUCTEX SC", "BATTERY BLACK" (manufactured by Colombia Carbon Japan Co., Ltd.), #3000 (manufactured by Mitubishi Chemical Corp.), "DENKA BLACK" (manufactured by Denki Kagaku Kogyo K K), "VULCAN XC-72R" (manufactured by Cabot) may be preferably used.

An additive amount of the light/heat transforming agent in the mixed film used in the present invention relative to the entire composition of the heat-sensitive layer is in the range of 1 to 70% by weight, preferably in the range of 5% to 50% by weight.

The binder to be used in forming the heat-sensitive layer in the form of the mixed film may employ any known binder that can dissolve or disperse the light/heat transforming material therein. The binder may include by way of example but not limited to: cellulose such as nitro cellulose and ethyl cellulose; cellulose derivatives; homopolymer or copolymer of vinyl compounds such as vinyl halide, vinyl ether, vinyl ester such as poly vinyl acetate, and vinyl ketone; homopolymer or copolymer of styrene monomer such as polystyrene and poly α-methylstyrene; homopolymer or copolymer of methacrylate ester such as acrylate ester and poly methyl methacrylate; homopolymer or copolymer of acrylate amide or methacrylate amide; ethylene-vinyl acetate copolymer and saponified polymer thereof; copolymer such as ethylene-acrylate and ethylene-methacrylate; rubbers including synthetic rubber such as ethylene-α-olefin copolymer elastomer, isoprene and styrene-butadiene, chlorinated rubber, and natural rubber; polymer such as polyethylene, polypropylene, acid-denatured polyolefin, polysulfone, polyacetal, polyphenylene oxide, polyurea, polyurethane, polyamide, polyester, polycarbonate and phenolic resin; and additionally those binders used in, what is called, "chemical amplifying system" as disclosed in "J. Imaging Sci., P59–64, 30(2), (1986) (Frechet et al.)", "Polymers in Electronics (Symposium Series, P11, 242, T. Davidson, Ed., ACS Washington, D.C. (1984) (Ito, Willson)" and "Mcroelectronic Engineering, P3–10, 13 (1991) (E. Reichmanis, L. F. Thompson)".

The above listed binders may be used alone or in combination of two or more kinds thereof.

If the heat-sensitive layer is formed as the mixed film, additives in addition to the light/heat transforming agent and the binder may be used. Those additives may be appropriately added corresponding to different purposes of, for example, improving a mechanical strength of the heat-sensitive layer, improving a sensitivity for the laser recording, improving the dispersibility of the dispersant in the heat-sensitive layer, improving an adhesiveness to any adjacent layers, such as the substrate, the silicone rubber layer, and so on.

For example, many different kinds of cross-linking agents for curing the heat-sensitive layer may be added in order to improve the mechanical strength of the heat-sensitive layer. The cross-linking agent may include, for example, but not be limited to, a combination of multifunctional isocyanate compound or multifunctional epoxy compound with compound containing hydroxyl group, carboxylic compound, thiol compound, amine compound or ureal compound.

An additive amount of the cross-linking agent used in the present invention relative to the entire composition of the heat-sensitive layer may be in the range of 1% to 50% by weight, preferably in the range of 2% to 20% by weight.

In order to improve the sensitivity for the laser recording, any known compound that can be decomposed by heating to generate a gas may be added as an additive. In this case, a rapid cubical expansion of the heat-sensitive layer help improve the sensitivity for the laser recording, and examples of the additive may include dinitro-pentamethylene-tetramine, N,N'-dimethyl-N,N'-dinitroso-terephthalamide, p-toluensulfonyl-hydrazide, 4,4-oxybis (benzensulfonyl-hydrazide), diamidebenzene and so on.

Alternatively, in order to improve the sensitivity for the laser recording, any known compound of thermal acid-forming agent that can be decomposed by heating to produce acid compound may be used as an additive, including a variety of iodonium salt, sulfonium salt, phosphonium tosylate, oxime sulfonate, dicarbodiimide sulfonate, triazine and so on. Use of those compounds in combination with the binders of chemical amplifying system may help decrease significantly the temperature of decomposition of the binders of the chemical amplifying system, which constitute the heat-sensitive layer, and resultantly improve the sensitivity for the laser recording.

When such a pigment as the carbon black is used as the light/heat transforming agent, a variety of pigment dispersant may be used as an additive in order to improve a dispersibility of the pigment.

An additive amount of the pigment dispersant used in the present invention relative to the light/heat transforming agent is in the range of 1% to 70% by weight, preferably in the range of 5% to 50% by weight.

In order to improve the adhesiveness to the adjacent layer, any known adhesion improving agent such as silane coupling agent and titanate coupling agent, as well as a binder providing a good adhesiveness with the adjacent layer, including polyurethane resins, acrylate resins containing vinyl group, acrylate resins containing hydroxyl group, acrylamide resins, ethylene-vinyl acetate copolymer, vinyl chloride-vinyl acetate copolymer, cellulose derivative, gelatin and the like may be added.

An additive amount of the adhesion improving agent or the adhesion improving binder as described above to be used in the present invention relative to an entire composition of the heat-sensitive layer may be in the range of 5% to 70% by weight, preferably in the range of 10% to 50% by weight.

In order to improve the application properties, a surfactant such as a fluoric sutfactant and a nonionic surfactant may be added as an additive.

An additive amount of the surfactant to be used in the present invention relative to an entire composition of the heat-sensitive layer may be in the range of 0.01% to 10% by weight, preferably in the range of 0.05% to 1% by weight.

A variety of additives other than those described above may be appropriately used if necessary.

A film thickness of the heat-sensitive layer to be used in the present invention may be in the range sufficient to be deposited into thin film by the evaporation method or the sputtering method for the single film, which is, for example, 50 to 1000 Å, preferably 100 to 800 Å. As for the mixed film, it may be formed by the coating operation, and the thickness thereof may be in the range of 0.05 to 10 $\mu$m, preferably in the range of 0.1 to 5 $\mu$m.

A dry lithographic plate of the present invention must have a flexibility sufficient to be set in a typical printing machine and also withstand the load applied thereto during the printing operation. Accordingly, a typical substrate may include a coated paper, a metallic plate such as aluminum plate, a plastic film such as polyethylene terephthalate film and a rubber sheet or any composites thereof, and preferably, it may be the coated paper, the aluminum plate, the plate of alloy containing aluminum (e.g., an alloy of aluminum with such metal as silicon, copper, manganese, magnesium, chrome, zinc, lead, bismuth and nickel), and the plastic film. In addition, a variety of surface treatment, such as corona discharge treatment, mat-finished easy adhesion treatment and antistatic treatment, may be applied to the substrate for improving the adhesiveness and/or the antistatic property of the surface thereof.

Further, thus treated substrates may be bonded to each other by using glue and the like.

Although a thickness of the substrate may be appropriately in the range of 25 $\mu$m to 3 mm, preferably 75 $\mu$m to 500 $\mu$m, an optimal thickness may be varied depending on the type of the substrate and the printing condition employed in respective specific cases. Generally, the thickness in a range of 100 $\mu$m to 300 $\mu$m is most preferred.

In the present invention, a primer layer may be disposed between the substrate and the heat-sensitive layer. The primer layer used in the present invention may employ many different types of primer layer in order to improve the adhesiveness between the substrate and the heat-sensitive layer and/or to improve the printing properties. There are many ways to form such primer layer as disclosed, for example, in Japanese Patent Laid-open Publication No. Sho 60-22903 in which various kinds of photosensitive polymers are exposed and cured before the photosensitive resin layer is formed, in Japanese Patent Laid-open Publication No. Sho 62-50760 in which epoxy resin is subjected to the thermosetting process, in Japanese Patent Laid-open Publication No. Sho 63-133151 in which gelatin is cured to form a film, in Japanese Patent Laid-open Publication No. Hei 3-200965 in which urethane resin and silane coupling agent are used, and in Japanese Patent Laid-open Publication No. Hei 3-273248 in which urethane resin is used. In addition to those, gelatin or casein may be effectively cured to form a film. Further, for the purpose of softening the primer layer, such a polymer having the glass transition temperature not higher than the room temperature may be added, including polyurethane, polyamide, styrene/butadiene rubber, carboxy-denatured styrene/butadiene rubber, acrylonitrile/butadiene rubber, carboxy-denatured acrylonitrile/butadiene rubber, polyisoprene, acrylate rubber, polyethylene, chlorinated polyethylene and chlorinated polypropylene. An addition ratio of the above polymer may be arbitrary determined, and the additive may be used alone to form the primer layer so far as it can form a film layer. Further; according to the purposes specified above, the primer layer of those materials may contain an additive such as dye, pH indicator, baking agent, photopolymerization initiator, adhesion auxiliary (e.g., polymeric monomer, diazo resin, silane coupling agent, titanium coupling agent and aluminum coupling agent), pigment, silica powder, and titanium oxide powder. Further, the primer layer may be cured by the exposure after being applied. Generally, an application amount of the primer layer may be appropriately in the range of 0.1 to 10 $g/m^2$, preferably 0.3 to 7 $g/m^2$, more preferably 0.5 to 5 $g/m^2$.

Based on the fact that the silicone rubber layer of the dry lithographic plate of the present invention is flexible and easily scarred, for the purpose of protecting the surface of the silicone rubber, a transparent film made of, for example, polyester such as polyethylene terephthalate and polyethylene naphthalate, polyethylene, polypropylene, polystyrene, poly vinyl chloride, poly vinylidene chloride, poly vinyl alcohol and cellophane may be laminated thereon, or a polymer may be coated on the silicone rubber layer. Those films may be drawn to use. Further, the mat finishing may be applied to the surface thereof, but the surface without mat finishing may be preferred in the present invention from the viewpoint of the image reproducibility.

Further, the dry lithographic printing master plate according to the present invention may be wound into a roll so as to be used as a plate for a CTC printing machine.

A laser used for exposing the dry lithographic printing master plate of the present invention is not specifically limited but may be any one so far as it is capable of giving an amount of exposure required to induce the degradation of adhesion sufficient to cause the silicone rubber layer to be stripped and removed, and such lasers including Ar laser, gas laser such as carbon dioxide gas laser, solid state laser such as YAG laser and semiconductor laser may be employed. lypically, the laser having an output power in the class of 50 mW or higher may be required. From the practical viewpoints of maintenance, price and the like, preferably the semiconductor laser and the semiconductor excited solid state laser (the YAG laser) may be used.

The recording wavelength of those lasers falls in a wavelength range of the infrared ray and often uses an oscillation wavelength of 800 to 1100 nm.

Further, an imaging apparatus as disclosed in Japanese Patent Laid-open Publication No. Hei 6-186750 may be used for the exposure.

When the film designed for protecting the surface of the silicone rubber layer is provided as described above, and if the film is a light transmissive film, then the laser exposure may be directly applied thereto without any pre-treatment, or may be applied after the film having been stripped off.

As for a developer to be used in a preparation of the dry lithographic printing master plate of the present invention, any known developer for the dry lithographic printing master plate may be used, including, for example, hydrocarbons, polar solvents, the water and a combination thereof, wherein from the viewpoint of safety, preferably the water or an aqueous solution of organic solvent containing water as a main component may be used, and in consideration of safety and inflammability, a concentration of the organic solvent may be preferably below 40% by weight.

The employable hydrocarbons may include aliphatic hydrocarbons [specifically, for example, hexane, heptane, gasoline, kerosene, and a commercially available solvent "Isober E, H, G" (manufacture by Esso Chemical K.K.)], aromatic hydrocarbons (e.g., toluene, xylene) and hydrocarbon halide (e.g., trichloroethylene). Further, the polar solvents may include alcohol (specifically, for example, methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol and tetraethylene glycol), ketone (e.g., acetone and methyl ethyl ketone), esters (e.g., ethyl acetate, methyl lactate, butyl lactate, propylene glycol monomethyl ether acetate, diethylene glycol acetate and diethyl phthalate), and others such as triethyl-phosphate, tricresyl-phosphate and so on. Alternatively, the water, such as tap water, purified water and distilled water may be used directly. Those listed above may be used alone or in the combination of two or more kinds, for example, the hydrocarbons added with the water, the polar solvents added with the water, or the hydrocarbons combined with the polar solvents.

Among the above-listed hydrocarbons and polar solvents, especially those having a poor affinity to the water may be added with a surfactant or the likes to improve their solubility to the water. Besides, an alkaline agent (e.g., sodium carbonate, diethanolamine and sodium hydrate) may be added thereto in conjunction with the surfactant.

The development may be performed in any known method in which, for example, the plate surface is rubbed with a developing pad containing the above-described developer or the developer is poured over the plate surface and then the plate surface is brushed in the water by using a developing brush. The developer may be set to any temperature, preferably in a range of 10° C. to 50° C. Through this treatment, the silicone rubber layer, which is an ink repellent layer, in the imaging area may be removed, and that area turns to be an ink receptive area.

The above-described developing process and subsequent water washing and drying processes may be carried out in an automatic processing machine. One preferred automatic processing machine has been disclosed in Japanese Patent Laid-open Publication No. Hei 2-220061.

Alternatively, the dry lithographic master plate of the present invention can be developed through such processes in which the adhesion layer is affixed to the surface of the silicone rubber layer and then the adhesion layer is stripped off. Any type of conventionally known adhesion layer may be used so far as it can adhere closely to the surface of the silicone rubber layer. One such adhesion layer disposed on a flexible support member is commercially available from Sumitomo 3M Ltd. as the brand name of "Scotch Tape #851A", for example.

Further, for storing thus processed printing plates as stacked one on another, preferably guard sheets may be inserted between plates for protecting those printing plates.

EXAMPLES

The present invention will now be described in more detail with reference to some exemplary examples. However, it is to be understood that the present invention is not limited to the exact examples described below.

Examples 1–3

Comparative Examples 1–5

[Formation of a Heat-sensitive Layer 1]

On top of a 188 μm thick polyester film applied with the corona discharge treatment, "E-5101" (manufactured by Toyobo Co., Ltd.), a 200 Å thick titanium oxide thin film was formed as a heat-sensitive layer by the sputtering method.

[Formation of a Silicone Layer 1]

Coating solution comprising the components described below was prepared by a variety of methods as described in Table 1 and was allowed to stand for the time periods described in Table 1, and the thus prepared coating solution was applied onto the above-described heat-sensitive layer by using a spin coater so as to form a dry film having a thickness of 2 μm, and then dried by heating and drying at 130° C. for 1 minute to form a silicone rubber layer.

| | |
|---|---|
| (a) Dimethylpolysiloxane having hydroxyl groups in both ends (degree of polymerization 700) | 9 parts by weight |
| (b) Dibutyltin dioctanate | 0.2 parts by weight |
| (c) Methyltriacetoxysilane | 0.5 parts by weight |

Solvent: Isober G (manufactured by Esso Chemical K.K.) (referred to as IG in abbreviation in Table 1)

On top of the thus obtained silicone rubber layer, a 12 μm thick polyethylene terephthalate was laminated, and thereby respective dry lithographic printing master plates were obtained as designated in the Examples 1 to 3 and the Comparative examples 1 to 5.

Writing operation was executed on respective samples of thus obtained dry lithographic printing master plates by using a semiconductor laser with a wavelength of 830 nm, a beam diameter of 32 μm ($1/e^2$) and an output power of 300 mW so as to write continuous lines thereon at different writing speeds under two different conditions where one sample had been left for five days in room temperature and the other sample had been left for three days in the specific environment defined by the temperature of 45° C. and the humidity of 75%, respectively after being coated and then the cover films had been stripped off from the respective samples for the writing operation. Then, a developing pad wetted with the water was used to wipe the plate surfaces and thereby remove the silicone rubber layers in the laser-irradiated areas, and after that the removal conditions of the silicone rubber layer were observed. The result was evaluated in accordance with the following criteria: ○ for the sample having good adhesion with no stripping-off of the silicone rubber layer observed in the region of the imaging area; X for the sample having the stripping-off of the silicone rubber layer observed in the region of the imaging area; and X X for the sample having the stripping-off of the silicone rubber layer observed clearly in the region of non-imaging area.

Each result of evaluations is shown in Table 1 below.

TABLE 1

| Example | Preparation method of silicone rubber solution | Period from preparation to application of the solution | Silicon rubber layer/heat-sensitive layer adhesiveness: 5 days after application | Silicon rubber layer/heat-sensitive layer adhesiveness: preserved for 3 days at 45° C., 75% |
|---|---|---|---|---|
| Example 1 | Dissolve (a) and (b) in IG of 80 parts by weight and stir it for 1 hour (solution A). Dissolve (c) in IG of 40 parts by weight and stir it for 1 hour (solution B). Mix solution A with solution B. | 1 minute | ○ | ○ |
| Example 2 | Dissolve (a) and (b) in IG of 80 parts by weight and stir it for 1 hour (solution A). Dissolve (c) in IG of 40 parts by weight and stir it for 1 hour (solution B). Mix solution A with solution B. | 5 hours | ○ | ○ |
| Example 3 | Dissolve (a) and (b) in IG of 80 parts by weight and stir it for 1 hour (solution A). Dissolve (c) in IG of 40 parts by weight and stir it for 1 hour (solution B). Mix solution A with solution B. | 8 hours | ○ | ○ |
| Comparative example 1 | Dissolve (a) in IG of 120 parts by weight and stir it for 1 hour, add (c) thereto and stir it for 1 hour and finally add (b) thereto and stir it for 1 hour. | 1 minute | ○ | X |
| Comparative example 2 | Dissolve (a) in IG of 120 parts by weight and stir it for 1 hour, add (c) thereto and stir it for 1 hour and finally add (b) thereto and stir it for 1 hour. | 5 hours | ○ | X |
| Comparative example 3 | Dissolve (a) in IG of 120 parts by weight and stir it for 1 hour, add (c) thereto and stir it for 1 hour and finally add (b) thereto and stir it for 1 hour. | 8 hours | X | X |
| Comparative example 4 | Mix all of the components of (a), (b) and (c) together in IG of 120 parts by weight and stir it for 1 hour. | 1 minute | X | X X |
| Comparative example 5 | Mix all of the components of (a), (b) and (c) together in IG of 120 parts by weight and stir it for 1 hour. | Gelled after 3 hours | — | — |

The above result shows that each of the dry lithographic printing master plates manufactured by applying the coating solution for the silicone rubber layer which has been prepared according to the method of the present invention has a good adhesiveness between the silicone rubber layer and the heat-sensitive layer. In specific, the coating solution was observed to be extremely stable for every different time period defined by the time from the final mixing of the coating solution (after the preparation of the solution) to the actual application thereof, which was varied in a wide range of 1 minute, 5 hours and 8 hours, and accordingly the adhesiveness between thus obtained silicone rubber layer and the heat-sensitive layer was observed good when the samples had been preserved not only under the room temperature but also under the condition of high temperature and high humidity (Examples 1 to 3). In contrast, it was observed in each of the dry lithographic printing master plates manufactured by applying the coating solution for the silicone rubber layer which had been prepared in a modified sequence of adding processes of respective components, which was different from that of the present invention (Comparative examples 1 to 3), that the silicone rubber layer was stripped off in the region of the imaging area under the preserving condition of high temperature and high humidity irrespective of the time period after the preparation of the solution up to the application thereof. It was also apparent that when the time period from the preparation to the application of the coating solution had been such a long period as 8 hours, even if the sample had been preserved under the room temperature, the adhesiveness of the silicone rubber layer was deteriorated, which means that the stability of the coating solution was extremely bad. Besides, it was found that in each of the dry lithographic printing master plates manufactured by applying the coating solution for the silicone rubber layer which had been prepared according to the method in which all of the components were added at once (Comparative examples 4 and 5), the adhesiveness between the silicone rubber layer and the heat-sensitive layer was extremely deteriorated even in the case where the coating solution was applied 1 minute after the preparation of the solution, wherein the silicone rubber layer was observed to be stripped off even under the room temperature and more disadvantageously the stripping-off in the non-imaging area was observed under the condition of high temperature and high humidity.

Examples 4–9

Comparative Examples 6–13

[Formation of an Under Coat Layer]

On top of a 188 μm thick polyester film applied with the corona discharge treatment, "E-5101" (manufactured by Toyobo Co., Ltd.), a coating solution as defined below was applied by the wire bar coating method and dried at 180° C. for 30 seconds, thus formed an under coat layer having a dry film thickness of 0.2 μm.

| | |
|---|---|
| AA-64 (polyester latex manufactured by Japan NSC Co., Ltd., solid content 30% by weight) | 5 parts by weight |
| $SnO_2$ particle dispersions in water (17% by weight) | 15 parts by weight |
| Emulgen 911 (polyoxyethylene alkylphenyl ether manufactured by Kao Corp., 10% by weight) | 2 parts by weight |
| Distilled water | 80 parts by weight |

[Formation of an Intermediate Layer]

A coating solution as defined below was applied over above-described under coat layer by the wire bar coating method and dried at 170° C. for 30 seconds, thus formed an intermediate layer having a dry film thickness of 0.05 μm.

| | |
|---|---|
| AA-64 (polyester latex manufactured by Japan NSC Co., Ltd., comprising solid content (30% by weight)) | 3.5 parts by weight |
| MX-300 (matting agent of polymethacrylic resin manufactured by Souken Chemical Co., Ltd., average particle size: 3.0 μm) | 0.03 parts by weight |
| Emulgen 911 (polyoxyethylene alkylphenyl ether manufactured by Kao Corp., 10% by weight) | 1.0 parts by weight |
| Distilled water | 95 parts by weight |

[Formation of a Heat-sensitive Layer 2]

A mixture as defined below was stirred together with glass beads in a paint shaker for 30 minutes so as to disperse the carbon black, and after the glass beads having been filtered out, added with a fluorine contained surfactant, Megafac F176 (manufactured by Dainippon Ink & Chemicals Inc.) by 0.005 g and stirred, thus prepared a coating solution for heat-sensitive layer.

This coating solution was applied over above-described intermediate layer by the micro gravure coating method so as to form the dry film thickness of 1 μm and then dried by heating at 130° C. for 30 seconds, thus formed a heat-sensitive layer.

| | |
|---|---|
| COATRON MW-060 (polyurethane manufactured by Sanyo chemical Industries, Ltd.) | 4.0 parts by weight |
| Carbon black (MA-220 manufactured by Mitubishi Chemical Corp.) | 2.5 parts by weight |
| SOLTHPATH S24000R (manufacture by ICI Corp.) | 0.3 parts by weight |
| Propylene glycol monomethyl ether | 100.0 parts by weight |

[Formation of a Silicone Rubber Layer 2]

Coating solutions comprising the components described below was prepared by a variety of the methods as described in Table 2 and was allowed to stand for the time periods described in Table 2, and the thus prepared coating solution was applied onto the above-described heat-sensitive layer by the fountain coater method so as to form a dry film thickness of 2 μm, and then dried by heating at 150° C. for 30 seconds to form a silicone rubber layer.

| | |
|---|---|
| (d) α,ω-divinylpolydimethylsiloxane (degree of polymerization 500) | 9 parts by weight |
| (e) Olefin-chloroplatinic acid | 0.15 parts by weight |
| (f) $(CH_3)_3SiO(SiH(CH_3)O)_8$-$Si(CH_3)_3$ | 0.2 parts by weight |
| (g) Reaction control agent [$HC{\equiv}C—C(CH_3)_2—O—Si(CH_3)_3$] | 0.2 parts by weight |

Solvent: ISOBER E (manufactured by Esso Chemical Co., Ltd.) (referred to as IE in abbreviation in Table 2)

In the Examples 4 and 7 and the Comparative example 12, respective solutions were delivered by a pump, mixed by an inline mixer immediately before the application, and then applied. Other solutions were directly delivered to the coating site by the pump.

On top of thus obtained silicone rubber layer, a 12 μm thick polyethylene terephthalate was laminated in a coating machine, thus obtained respective dry lithographic printing master plates designated in the Examples 4 to 9 and the Comparative examples 6 to 13.

Writing operation was executed on respective samples of thus obtained dry lithographic printing master plates by using a semiconductor laser with a wavelength of 830 nm, a beam diameter of 32 $\mu$m ($1/e^2$) and an output power of 300 mW so as to write continuous lines thereon at different writing speeds under two different conditions where one sample had been left for five days in room temperature and the other sample had been left for one day in the room temperature and then three days in the specific environment defined by the temperature of 45° C. and the humidity of 75%, respectively after being coated and then the cover films had been stripped off from the respective samples for the writing operation. Then, a developing pad wetted with a solution containing 0.2% of nonionic surfactant was used to wipe the plate surface and thereby remove the silicone rubber layer in the laser irradiated area, and after that the removal conditions of the silicone rubber layer were observed. The result was evaluated in accordance with the following criteria: ○ for the sample having good adhesion with no stripping-off of the silicone rubber layer observed in the region of the imaging area; and X for the sample having the stripping-off of the silicone rubber layer observed in the region of the imaging area.

Each result of evaluations is shown in Table 2 below.

TABLE 2

| Example | Preparation method of silicone rubber solution | Period from preparation to application of the solution | Silicon rubber layer/heat-sensitive layer adhesiveness: 5 days after application | Silicon rubber layer/heat-sensitive layer adhesiveness: preserved for 3 days at 45° C., 75%. |
|---|---|---|---|---|
| Example 4 | Dissolve (a) and (b) in IE of 120 parts by weight and stir it for 1 hour (solution A). Dissolve (c) and (d) in IE of 40 parts by weight and stir it for 1 hour (solution B). Mix solution A with solution B. | 1 minute | ○ | ○ |
| Example 5 | Dissolve (a) and (b) in IE of 120 parts by weight and stir it for 1 hour (solution A). Dissolve (c) and (d) in IE of 40 parts by weight and stir it for 1 hour (solution B). Mix solution A with solution B. | 5 hours | ○ | ○ |
| Example 6 | Dissolve (a) and (b) in IE of 120 parts by weight and stir it for 1 hour (solution A). Dissolve (c) and (d) in IE of 40 parts by weight and stir it for 1 hour (solution B). Mix solution A with solution B. | 8 hours | ○ | ○ |
| Example 7 | Dissolve (a) in IE of 120 parts by weight and stir it for 1 hour, add (b) thereto and stir it for 90 minutes (solution A). Dissolve (c) and (d) in IE of 40 parts by weight and stir it for 1 hour (solution B). Mix solution A with solution B. | 1 minute | ○ | ○ |
| Example 8 | Dissolve (a) in IE of 120 parts by weight and stir it for 1 hour, add (b) thereto and stir it for 90 minutes (solution A). Dissolve (c) and (d) in IE of 40 parts by weight and stir it for 1 hour (solution B). Mix solution A with solution B. | 5 hours | ○ | ○ |
| Example 9 | Dissolve (a) in IE of 120 parts by weight and stir it for 1 hour, add (b) thereto and stir it for 90 minutes (solution A). Dissolve (c) and (d) in IE of 40 parts by weight and stir it for 1 hour (solution B). Mix solution A with solution B. | 8 hours | ○ | ○ |
| Comparative example 6 | Dissolve all of the components of (a), (b), (c) and (d) together in IE of 160 parts by weight and stir it for 1 hour. | 1 minute | ○ | ○ |
| Comparative example 7 | Dissolve all of the components of (a), (b), (c) and (d) together in IE of 160 parts by weight and stir it for 1 hour. | 5 hours | X | X |
| Comparative example 8 | Dissolve all of the components of (a), (b), (c) and (d) together in IE of 160 parts by weight and stir it for 1 hour. | 8 hours | X | X |
| Comparative example 9 | Dissolve (a) in IE of 160 parts by weight and stir it for 1 hour, add (c) and (d) thereto and stir it for 1 hour. Further add (b) thereto and stir it for 1 hour. | 1 minute | ○ | ○ |
| Comparative example 10 | Dissolve (a) in IE of 160 parts by weight and stir it for 1 hour, add (c) and (d) thereto and stir it for 1 hour. Further add (b) thereto and stir it for 1 hour. | 5 hours | ○ | X |
| Comparative example 11 | Dissolve (a) in IE of 160 parts by weight and stir it for 1 hour, add (c) and (d) thereto and stir it for 1 hour. Further add (b) thereto and stir it for 1 hour. | 8 hours | ○ | X |
| Comparative example 12 | Dissolve (a) in IE of 120 parts by weight and stir it for 1 hour (solution A). Dissolve (b), (c) and (d) in IE of 40 parts by weight and stir it for 1 hour (solution B). Mix solution A with solution B. | 1 minute | X | X |

TABLE 2-continued

| Example | Preparation method of silicone rubber solution | Period from preparation to application of the solution | Silicon rubber layer/heat-sensitive layer adhesiveness 5 days after application | Silicon rubber layer/heat-sensitive layer adhesiveness preserved for 3 days at 45° C., 75%. |
|---|---|---|---|---|
| Comparative example 13 | Dissolve (a) in IE of 120 parts by weight and stir it for 1 hour (solution A). Dissolve (b), (c) and (d) in IE of 40 parts by weight and stir it for 1 hour (solution B). Mix solution A with solution B. | Gelled after 30 minutes | — | — |

The above result shows that each of the dry lithographic printing master plates manufactured by applying the coating solution for the silicone rubber layer which has been prepared according to the method of the present invention has a good adhesiveness between the silicone rubber layer and the heat-sensitive layer. In specific, the coating solution was observed to be extremely stable for every different time period defined by the time from the preparation of the coating solution to the actual application thereof, which was varied in a wide range of 1 minute, 5 hours and 8 hours, and accordingly the adhesiveness between thus obtained silicone rubber layer and the heat-sensitive layer was observed good when the samples had been preserved not only under the room temperature but also under the condition of high temperature and high humidity (Examples 4 to 9). In contrast, it was observed in each of the dry lithographic printing master plates manufactured by applying the coating solution for the silicone rubber layer which had been prepared by the method in which all of the components were added at once (Comparative examples 6 to 8), that a good result was exhibited in the case where the coating solution for the silicone rubber layer was applied 1 minute after the preparation thereof, while the stripping-off of the silicone rubber layer was observed in those cases where the coating solutions for the silicone rubber layers were applied 5 or 8 hours after they had been prepared, even in the cases of preservation of the sample being under the room temperature. Further, it was observed in each of the dry lithographic printing master plates manufactured by applying the coating solution for the silicone rubber layer which had been prepared in a modified sequence of adding processes of respective components, which was different from that of the present invention (Comparative examples 9 to 11), that a good result was exhibited in the case where the coating solution for the silicone rubber layer was applied 1 minute after the preparation thereof, while the stripping-off of the silicone rubber layer was observed in those cases where the coating solutions were applied 5 or 8 hours after they had been prepared and the samples were preserved under the condition of high temperature and high humidity. Still further, it was found that in each of the dry lithographic printing master plates manufactured by applying the coating solution for the silicone rubber layer which had been prepared in a modified sequence of adding processes of respective components, which was different from that of the present invention (Comparative examples 12 and 13), the stripping-off of the silicone rubber layer in the imaging area was observed even in the case where the coating solution was applied 1 minute after the preparation thereof and the sample was preserved under the room temperature, and further disadvantageously the coating solution was gelled after 30 minutes of its preparation, indicating that the stability of the coating solution was extremely low.

EFFECT OF THE INVENTION

According to the method for preparing the dry lithographic printing master plate of the present invention, such an innovative dry lithographic printing master plate could be manufactured that has eliminated uneven plate performance and more specifically that provides a stable adhesiveness between the heat-sensitive layer and the silicone rubber layer as well as an improved aging stability of the coating solution.

What is claimed is:

1. A method for preparing a master plate useful for making a dry lithographic printing plate comprising at least a heat-sensitive layer and a silicone rubber layer which are stacked in this order on a substrate, said method comprising the steps of:

(1) dissolving a diorgano-polysiloxane and a curing catalyst in a solvent;

(2) dissolving a cross-linking agent in another solvent;

(3) mixing the solution obtained in said step (1) with the solution obtained in said step (2); and (4) applying the mixture obtained in said step (3) over said heat-sensitive layer to thereby form said silicone rubber layer.

2. The method of claim 1, wherein said step (4) is carried out immediately after said step (3).

3. The method of claim 1 or 2, wherein said diorgano-polysiloxane has a carbon-carbon double bond and/or a hydroxyl group at the ends of the molecular chain thereof.

4. The method of claim 1, wherein said heat-sensitive layer contains a light/heat transforming agent and said light/heat transforming agent is a black pigment.

5. The method of claim 1, wherein said heat-sensitive layer contains a light/heat transforming agent and said light/heat transforming agent is a near infrared ray absorbing dye.

6. The method of claim 1, wherein said heat-sensitive layer is a metallic thin film.

7. A method for preparing a master plate useful for making a dry lithographic printing plate comprising at least a heat-sensitive layer and a silicone rubber layer which are stacked in this order on a substrate, said method comprising the steps of:

(5) dissolving a diorgano-polysiloxane having an addition reactive functional group and a curing catalyst in a solvent;

(6) dissolving a compound having at least two or more Si—H groups and a reaction control agent in another solvent;

(7) mixing the solution obtained in said step (5) with the solution obtained in said step (6); and (8) applying the mixture obtained in said step (7) over said heat-sensitive layer to thereby form said silicone rubber layer.

8. The method of claim 7, wherein said step (5) comprises the steps of: (5-1) dissolving the diorgano-polysiloxane having the addition reactive functional group in the solvent, and (5-2) adding the curing catalyst in the solution obtained in the step (5-1).

9. The method of claim 7 or 8, wherein said step (8) is carried out immediately after said step (7).

10. The method of claim 7, wherein said heat-sensitive layer contains a light/heat transforming agent and said light/heat transforming agent is a black pigment.

11. The method of claim 7, wherein said heat-sensitive layer contains a light/heat transforming agent and said light/heat transforming agent is a near infrared ray absorbing dye.

12. The method of claim 7, wherein said heat-sensitive layer is a metallic thin film.

* * * * *